(12) United States Patent
Hsu et al.

(10) Patent No.: US 7,956,442 B2
(45) Date of Patent: Jun. 7, 2011

(54) BACKSIDE CONNECTION TO TSVS HAVING REDISTRIBUTION LINES

(75) Inventors: Kuo-Ching Hsu, Chung-Ho (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 217 days.

(21) Appl. No.: 12/332,934

(22) Filed: Dec. 11, 2008

(65) Prior Publication Data
US 2010/0090318 A1    Apr. 15, 2010

Related U.S. Application Data

(60) Provisional application No. 61/104,172, filed on Oct. 9, 2008.

(51) Int. Cl.
*H01L 23/48* (2006.01)
*H01L 23/538* (2006.01)

(52) U.S. Cl. . 257/621; 257/766; 257/774; 257/E23.011; 257/E23.174

(58) Field of Classification Search .................. 257/621, 257/766, 774, E23.011, E23.174
See application file for complete search history.

(56) References Cited

U.S. PATENT DOCUMENTS

| | | | |
|---|---|---|---|
| 3,461,357 A * | 8/1969 | Mutter et al. | ................. 257/762 |
| 6,897,125 B2 | 5/2005 | Morrow et al. | |
| 2008/0079121 A1 | 4/2008 | Han | |
| 2009/0140381 A1 * | 6/2009 | Lin et al. | ........................ 257/528 |
| 2010/0013102 A1 * | 1/2010 | Tay et al. | ....................... 257/774 |
| 2010/0022034 A1 * | 1/2010 | Antol et al. | ..................... 438/15 |
| 2010/0090319 A1 | 4/2010 | Hsu et al. | |
| 2010/0276787 A1 | 11/2010 | Yu et al. | |

OTHER PUBLICATIONS

Shen, L-C, et al., "A Clamped Through Silicon Via (TSV) Interconnection for Stacked Chip Bonding Using Metal Cap on Pad and Metal Column Forming in Via," 2008, IEEE, pp. 544-549.

* cited by examiner

*Primary Examiner* — Victor Mandala
(74) *Attorney, Agent, or Firm* — Slater & Matsil, L.L.P.

(57) ABSTRACT

An integrated circuit structure includes a semiconductor substrate including a front side and a backside. A through-silicon via (TSV) penetrates the semiconductor substrate, and has a back end extending to the backside of the semiconductor substrate. A redistribution line (RDL) is over the backside of the semiconductor substrate and connected to the back end of the TSV. The integrated circuit structure further includes a passivation layer over the RDL; an opening in the passivation layer, wherein a portion of the RDL is exposed through the opening; and a nickel layer in the opening and contacting the RDL.

14 Claims, 6 Drawing Sheets

BACKSIDE CONNECTION TO TSVS HAVING REDISTRIBUTION LINES

This application claims the benefit of U.S. Provisional Patent Application Ser. No. 61/104,172, filed Oct. 9, 2008, and entitled "Formation Scheme for TSV Backside RDL and Pad," which application is hereby incorporated herein by reference.

TECHNICAL FIELD

This invention relates generally to integrated circuit structures, and more particularly to through-silicon vias, and even more preferably to the formation of bond pads connected to the through-silicon vias.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and lengths of interconnections between devices as the number of devices increases. When the number and the lengths of interconnections increase, both circuit RC delay and power consumption increase.

Among the efforts for resolving the above-discussed limitations, three-dimensional integrated circuit (3DIC) and stacked dies are commonly used. Through-silicon vias (TSVs) are thus used in 3DIC and stacked dies for connecting dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

FIG. 1 illustrates a conventional TSV 102 formed in chip 104. TSV 102 is in silicon substrate 106. Through the interconnections (metal lines and vias, not shown) in the metallization layers, TSV 102 is electrically connected to bond pad 108, which is on the front surface of chip 104. TSV 102 is exposed through the back surface of substrate 106 in the form of a copper post. When chip 104 is bonded to another chip, TSV 102 is bonded to a bond pad on the other chip, with or without solder therebetween. This scheme suffers from drawbacks. Since the TSV bonding requires relatively large pitch between TSVs, the locations of the TSVs are restricted and the distance between the TSVs needs to be big enough to allow room for, for example, solder balls. New backside structures are thus needed.

SUMMARY OF THE INVENTION

In accordance with one aspect of the present invention, an integrated circuit structure includes a semiconductor substrate including a front side and a backside. A conductive via (which may be a through-silicon via (TSV)) penetrates the semiconductor substrate, and has a back end extending to the backside of the semiconductor substrate. A redistribution line (RDL) is over the backside of the semiconductor substrate and connected to the back end of the TSV. The integrated circuit structure further includes a passivation layer over the RDL; an opening in the passivation layer, wherein a portion of the RDL is exposed through the opening; and a nickel layer in the opening and contacting the RDL.

In accordance with another aspect of the present invention, an integrated circuit structure includes a semiconductor substrate having a front side and a backside; and a conductive via (for example, a TSV) penetrating the semiconductor substrate. The TSV includes a back end extending beyond the backside of the semiconductor substrate. An RDL is formed over the backside of the semiconductor substrate and connected to the back end of the TSV, wherein the RDL includes an RDL strip contacting the TSV, and an RDL pad having a greater width than the RDL strip. The RDL pad joins the RDL strip. A passivation layer is formed over the RDL. An opening is formed in the passivation layer, wherein a middle portion of the RDL pad is exposed through the opening, and wherein the passivation layer covers edge portions of the RDL pad. A nickel layer is in the opening and contacts the middle portion of the RDL, wherein the nickel layer has a thickness greater than the thickness of the passivation layer.

The advantageous features of the present invention include improved bond ability and increased standoff between stacked dies.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments of the present invention provide many applicable inventive concepts that can be embodied in a wide variety of specific contexts. The specific embodiments discussed are merely illustrative of specific ways to make and use the invention, and do not limit the scope of the invention.

A novel backside connection structure connecting to through-silicon vias (TSVs) and the method of forming the same are provided. The intermediate stages of manufacturing a preferred embodiment of the present invention are illustrated. The variations of the preferred embodiments are discussed. Throughout the various views and illustrative embodiments of the present invention, like reference numbers are used to designate like elements.

Figure 1:
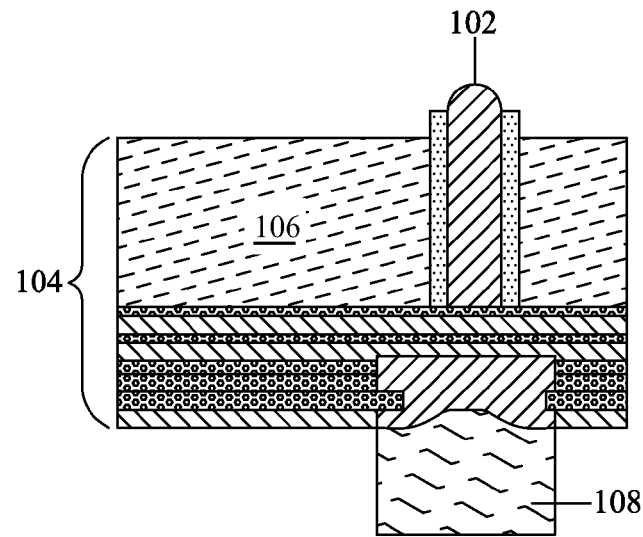
FIG. 1 illustrates a conventional integrated circuit structure including a through-silicon via (TSV), wherein the TSV protrudes through the backside of a substrate, and is bonded to a bond pad on another chip in the form of a copper post.
Figure 2:
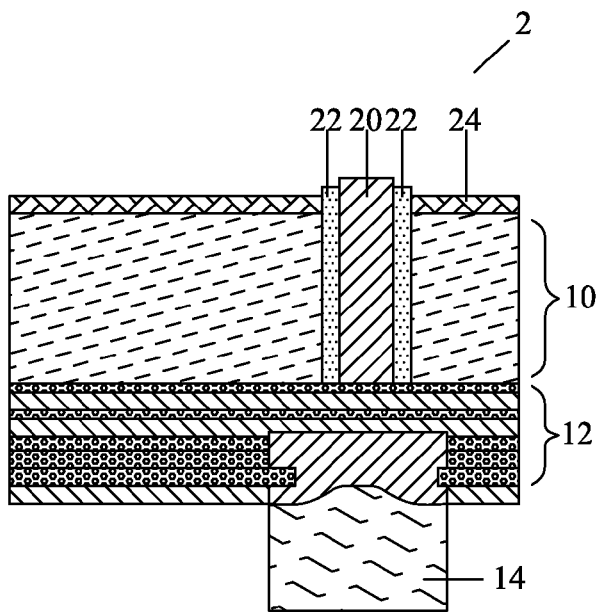
FIGS. 2 through 8 are top views and cross-sectional views of intermediate stages in the manufacturing of an embodiment of the present invention.

Referring to FIG. 2, chip 2, which includes substrate 10 and integrated circuits (not shown) therein, is provided. Substrate 10 is preferably a semiconductor substrate, such as a bulk silicon substrate, although it may include other semiconductor materials such as group III, group IV, and/or group V elements. Semiconductor devices, such as transistors (not shown), may be formed at the front surface (the surface facing down in FIG. 2) of substrate 10. Interconnect structure 12, which includes metal lines and vias (not shown) formed therein, is formed under substrate 10 and connected to the semiconductor devices. The metal lines and vias may be formed of copper or copper alloys, and may be formed using the well-known damascene processes. Interconnect structure 12 may include commonly known inter-layer dielectric (ILD) and inter-metal dielectrics (IMDs). Bond pad 14 is formed on the front side (the side facing down in FIG. 2) of, and protrudes beyond, the front surface of chip 2.

TSV 20 is formed in substrate 10, and extends from the back surface (the surface facing up in FIG. 2) to the front surface (the surface with active circuits formed thereon). In a first embodiment, as shown in FIG. 2, TSV 20 is formed using a via-first approach, and is formed before the formation of interconnect structure 12. Accordingly, TSV 20 only extends to the ILD that is used to cover the active devices, but not into the IMD layers in interconnect structure 12. In alternative embodiments, TSV 20 is formed using a via-last approach, and is formed after the formation of interconnect structure 12. Accordingly, TSV 20 penetrates through both substrate 10 and interconnect structure 12. Isolation layer 22 is formed on the sidewalls of TSV 20, and electrically insulates TSV 20 from substrate 10. Isolation layer 22 may be formed of commonly used dielectric materials such as silicon nitride, silicon oxide (for example, tetra-ethyl-ortho-silicate (TEOS) oxide), and the like.

TSV 20 is exposed through the back surface of substrate 10. Preferably, a backside isolation layer 24 is formed covering the backside of substrate 10. In an exemplary embodiment, the formation of backside isolation layer 24 includes etching back the back surface of substrate 10, blanket forming backside isolation layer 24, and lightly performing a chemical mechanical polish to remove the portion of backside isolation layer 24 directly over TSV 20. Accordingly, TSV 20 is exposed through an opening in backside isolation layer 24. In alternative embodiments, the opening in backside isolation layer 24, through which TSV 20 is exposed, is formed by etching.

Figure 3:
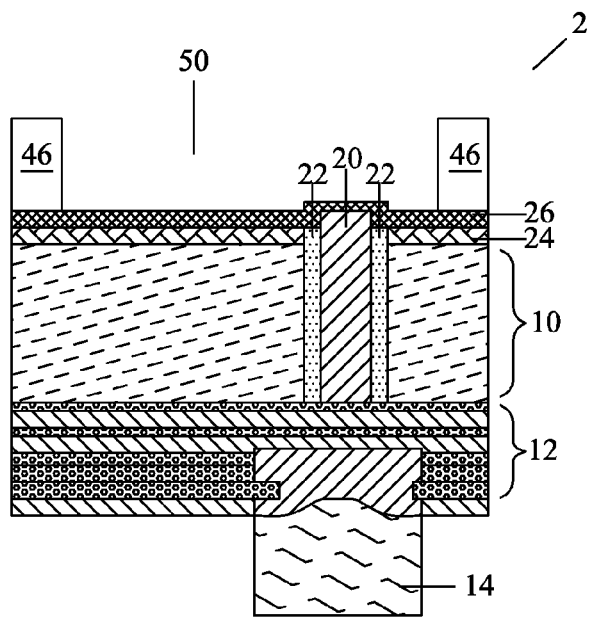

Referring to FIG. 3, a thin seed layer 26, also referred to as an under-bump metallurgy (UBM), is blanket formed on backside isolation layer 24 and TSV 20. The usable materials of UBM 26 include copper or copper alloys. However, other metals, such as silver, gold, aluminum, and combinations thereof, may also be included. In an embodiment, UBM 26 is formed using sputtering. In other embodiments, physical vapor deposition (PVD) or electro plating may be used.

FIG. 3 also illustrates the formation of mask 46. In an embodiment, mask 46 is a dry film, which may include an organic material such as Ajinimoto buildup film (ABF), Prepreg, resin-coated copper (RCC), or the like. Alternatively, mask 46 is formed of photoresist. Mask 46 is then patterned to form opening 50 in mask 46, with TSV 20 being exposed through opening 50.

Figure 4:
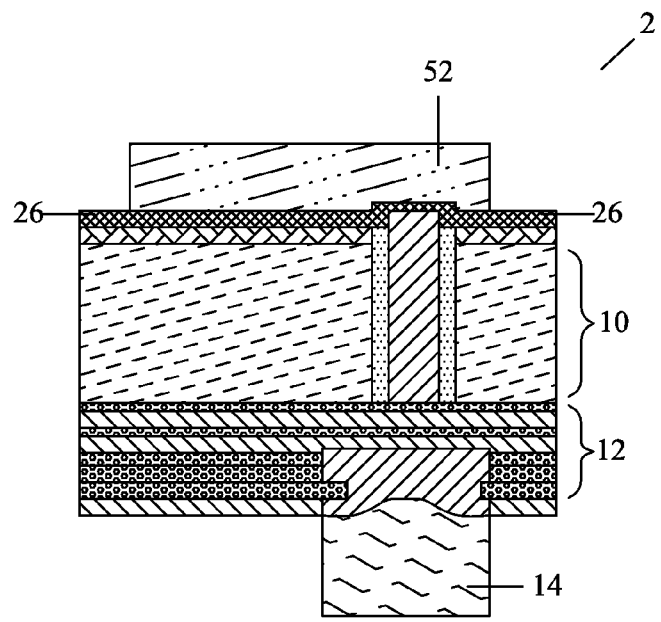

In FIG. 4, opening 50 is selectively filled with a metallic material, forming redistribution line (RDL) 52 in opening 50. In the preferred embodiment, the filling material includes copper or copper alloys, although other metals, such as aluminum, silver, gold, and combinations thereof, may also be used. The formation methods preferably include electrochemical plating (ECP), electroless plating, or other commonly used deposition methods such as sputtering, printing, and chemical vapor deposition (CVD) methods. Mask 46 is then removed. As a result, the portions of UBM 26 underlying mask 46 are exposed.

Figure 5:
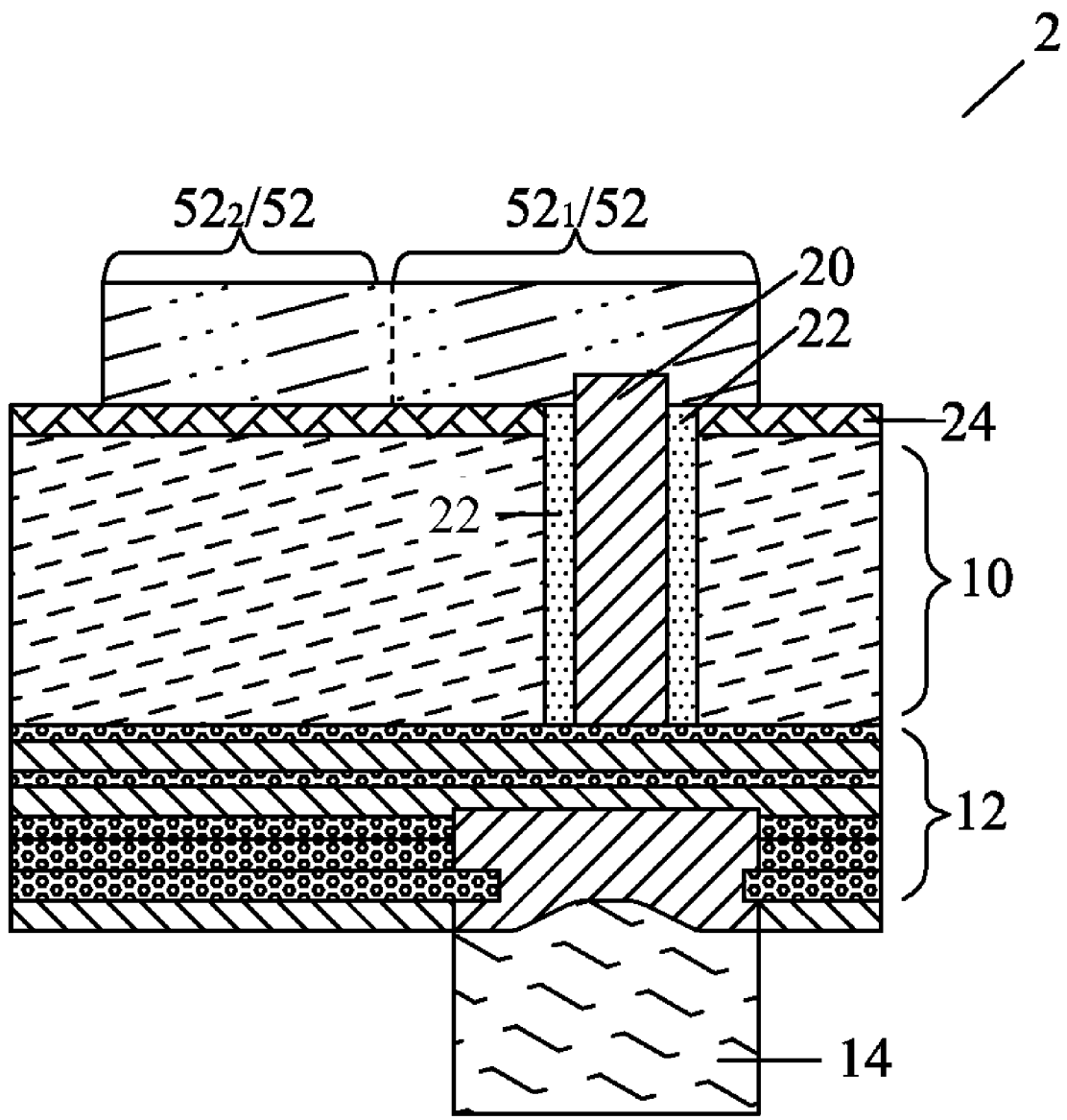

Referring to FIG. 5, the exposed portions of UBM 26 are removed by a flash etching. The remaining RDL 52 may include RDL strip (also referred to as redistribution trace) $52_1$ that includes a portion directly over, and connected to, TSV 20, and optionally RDL pad $52_2$ joining RDL strip $52_1$. A top view of RDL 52 may be found in FIG. 7. In FIG. 5 and subsequent figures, UBM 26 is not shown since it is typically formed of similar materials as RDL 52, and thus it appears to be merged with RDL 52. As a result of the flash etching, a thin layer of RDL 52 is also removed. However, the removed portion of RDL 52 is negligible compared to its overall thickness.

Figure 6A:
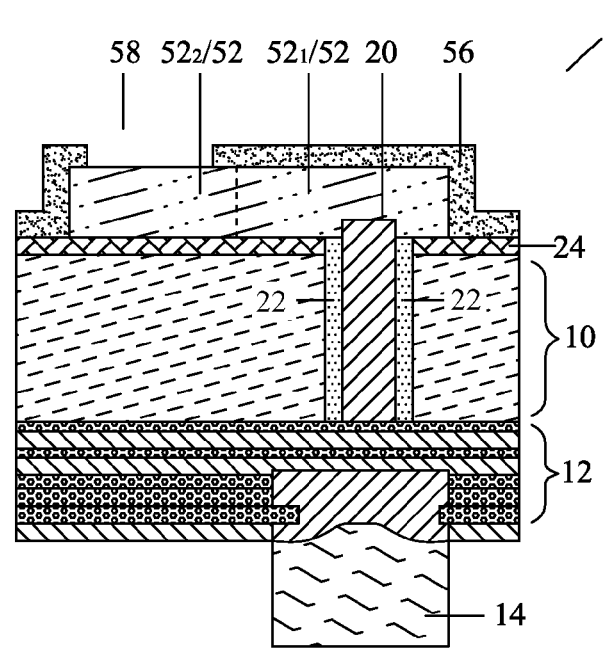
Figure 6B:
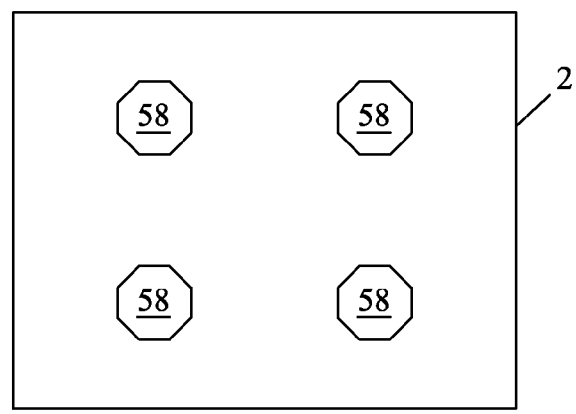

Next as shown in FIG. 6A, passivation layer 56 is blanket formed and patterned to form opening 58. Passivation layer 56 may be formed of nitrides, oxides, polyimide, and the like. A portion of RDL pad $52_2$ is exposed through opening 58 in passivation layer 56. Preferably, opening 58 occupies a center portion of RDL pad $52_2$ (please refer to FIG. 7). The RDL strip portion $52_1$ remains to be covered by passivation layer 56. It is realized that one chip may include a plurality of TSVs 20, as shown in FIG. 6B, which is a top view of chip 2. In the preferred embodiment, the sizes of openings 58 throughout chip 2 are substantially uniform. The uniform size of openings 58 results in the same amount of solder needed for bonding each of the plurality of TSVs, so that the likelihood of having cold joint or non-joint is reduced.

Figure 7:
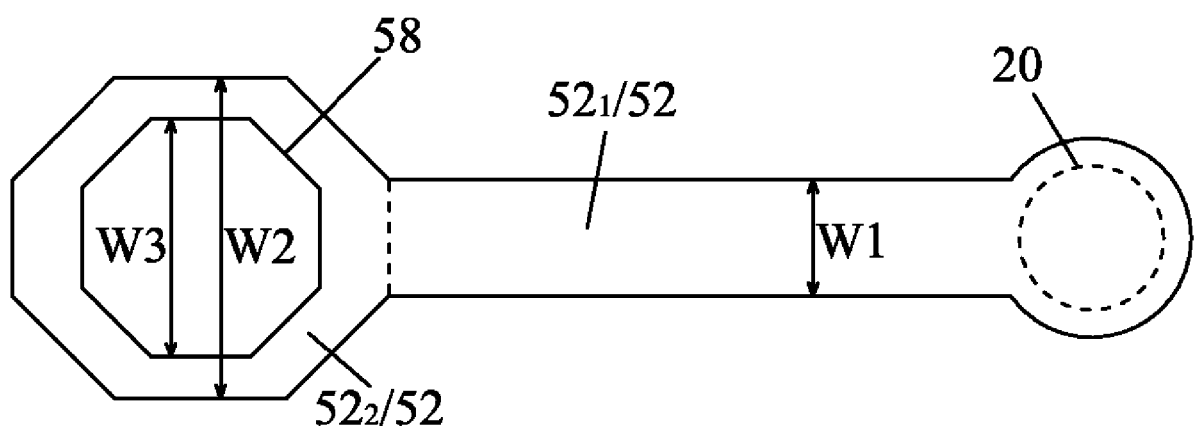

FIG. 7 illustrates a schematic top view of passivation opening 58 and RDL 52. Please note that the dimensions of the illustrated features are not in scale. Preferably, opening 58 has a smaller size than, and exposes a center portion of, RDL pad $52_2$. In an exemplary embodiment, RDL strip $52_1$ has a width W1 between about 5 μm and about 15 μm. RDL pad $52_2$ has a width W2 of about 80 μm to about 100 μm, while passivation opening 58 has a width W3 of about 70 μm to about 90 μm. The top view of passivation opening 58 may be octagon, hexagon, square, or any other applicable shape.

Figure 8:
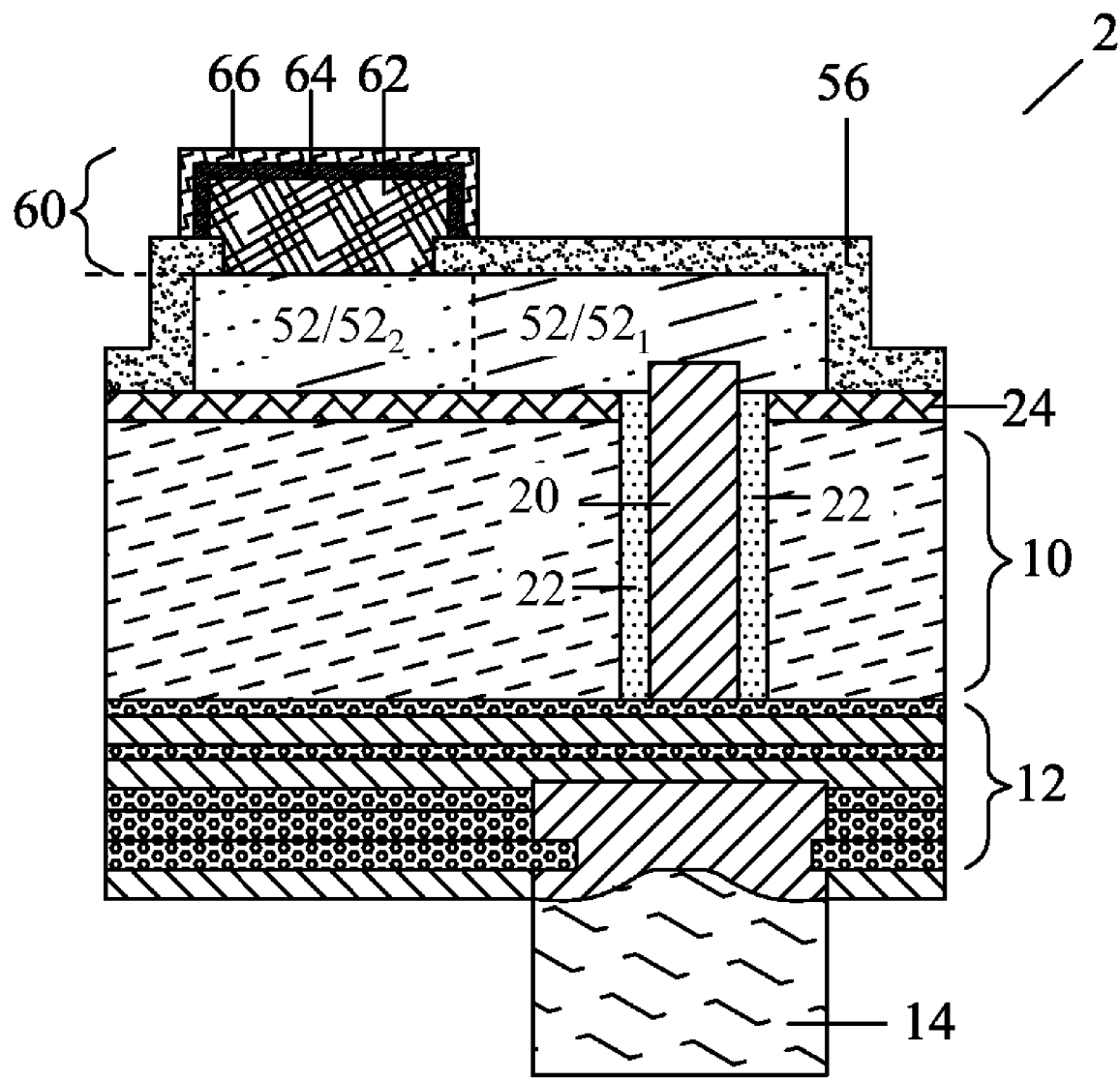

Next, as shown in FIG. 8, metal finish 60 is formed in opening 58. The formation methods of metal finish 60 include ECP, electroless plating, and the like. In the preferred embodiment, metal finish 60 includes nickel layer 62 directly on, and contacting, RDL pad $52_2$. Optionally, additional layers, such as a gold layer 66, or gold layer 66 on palladium layer 64, may be formed on nickel layer 62. The thickness of nickel layer 62 is greater than the thickness of passivation layer 56, so that the top surface of nickel layer 62 is higher than the top surface of passivation layer 56. The formation of palladium layer 64 and gold layer 66 further increases the height of the metal finish 60, so that the standoff between chip 2 (and the respective wafer in which chip 2 is located) and another chip, is adequate for the flow of the underfill that will be filled in subsequent packaging steps. With the formation of the metal finish as above-discussed, there is no need to form a copper pad in opening 58, or an eutectic bond pad in opening 58, wherein the eutectic bond pad may include an eutectic solder material formed of tin-lead (Sn—Pb) alloy, for example.

The embodiments of the present invention have several advantageous features. By forming the metal finish that may comprise nickel, gold, and the like, directly on RDLs, instead of forming copper or eutectic bonds, the possible oxidation that may occur to copper is avoided. Accordingly, the bond (soldering) ability is enhanced. Further, nickel may be directly formed to a thickness great enough to allow for enough standoff for the flow of the underfill that will be filled in the subsequent packaging steps.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a semiconductor substrate comprising a front side and a backside;
   a conductive via penetrating the semiconductor substrate, the conductive via comprising a back end extending to the backside of the semiconductor substrate;
   a redistribution line (RDL) on the backside of the semiconductor substrate and connected to the back end of the conductive via;
   a passivation layer over the RDL, with an opening in the passivation layer and a portion of the RDL being exposed through the opening; and
   a nickel layer in the opening and contacting the RDL.

2. The integrated circuit structure of claim 1, wherein the RDL comprises an RDL strip comprising a portion directly over, and contacting, the conductive via, and an RDL pad having a greater width than the RDL strip, the RDL pad joining the RDL strip, and wherein the opening exposes only a middle portion of the RDL pad.

3. The integrated circuit structure of claim 1 further comprising a gold layer over the nickel layer.

4. The integrated circuit structure of claim 3 further comprising a palladium layer between and adjoining the gold layer and the nickel layer.

5. The integrated circuit structure of claim 1, wherein the nickel layer comprises a top surface higher than a top surface of the passivation layer.

6. The integrated circuit structure of claim 1 further comprising:
   a plurality of conductive vias penetrating the semiconductor substrate;
   a plurality of RDLs at the backside of the semiconductor substrate, wherein each of the plurality of RDLs is connected to a back end of one of the plurality of conductive vias;
   a plurality of openings in the passivation layer, wherein a portion of each of the plurality of RDLs is exposed through one of the plurality of openings, and wherein the plurality of openings has substantially a same size; and
   a nickel layer in each of the plurality of openings and contacting one of the plurality of RDLs.

7. The integrated circuit structure of claim 1, wherein an interface of the RDL and the conductive via is on the backside of the semiconductor.

8. The integrated circuit structure of claim 1 further comprising a backside isolation layer contacting a back surface of the semiconductor substrate, wherein the conductive via protrudes out of the back surface of the semiconductor substrate to contact the RDL.

9. An integrated circuit structure comprising:
   a semiconductor substrate comprising a front side and a backside;
   a conductive via penetrating the semiconductor substrate, the conductive via comprising a back end extending beyond the backside of the semiconductor substrate;
   a redistribution line (RDL) over the backside of the semiconductor substrate and connected to the back end of the conductive via, the RDL comprising:
      an RDL strip contacting the conductive via; and
      an RDL pad having a greater width than the RDL strip, wherein the RDL pad joins the RDL strip;
   a passivation layer over the RDL;
   an opening in the passivation layer, wherein a middle portion of the RDL pad is exposed through the opening, and wherein edge portions of the RDL pad are covered by the passivation layer; and
   a nickel layer in the opening and contacting the middle portion of the RDL, wherein the nickel layer has a thickness greater than a thickness of the passivation layer.

10. The integrated circuit structure of claim 9, wherein the nickel layer comprises a top surface higher than a top surface of the passivation layer.

11. The integrated circuit structure of claim 9 further comprising a gold layer over the nickel layer.

12. The integrated circuit structure of claim 11 further comprising a palladium layer between and adjoining the nickel layer and the gold layer.

13. The integrated circuit structure of claim 9, wherein the integrated circuit structure is free from a pad over and contacting the RDL, with the pad formed of a material selected from the group consisting essentially of copper and an eutectic solder.

14. The integrated circuit structure of claim 9 further comprising:
   a plurality of conductive vias penetrating the semiconductor substrate;
   a plurality of RDLs at the backside of the semiconductor substrate, wherein each of the plurality of RDLs is connected to a back end of one of the plurality of conductive vias;
   a plurality of openings in the passivation layer, wherein a portion of each of the plurality of RDLs is exposed through one of the plurality of openings, and wherein the plurality of openings has substantially a same size; and
   a nickel layer in each of the plurality of openings and contacting one of the plurality of RDLs.

\* \* \* \* \*